United States Patent
Chew et al.

(10) Patent No.: US 6,744,129 B2
(45) Date of Patent: Jun. 1, 2004

(54) INTEGRATED GROUND SHIELD

(75) Inventors: Lee Chew, San Diego, CA (US); Jonathon Y. Cheah, San Diego, CA (US)

(73) Assignee: Microtune (San Diego), Inc., San Diego, CA (US)

(*) Notice: Subject to any disclaimer, the term of this patent is extended or adjusted under 35 U.S.C. 154(b) by 0 days.

(21) Appl. No.: 10/043,911

(22) Filed: Jan. 11, 2002

(65) Prior Publication Data
US 2004/0080038 A1 Apr. 29, 2004

(51) Int. Cl.⁷ .................. H01L 23/52; H01L 23/34
(52) U.S. Cl. .............. 257/691; 257/659; 257/750; 257/723; 257/E29.327
(58) Field of Search ................... 257/691, 750, 257/723, E29.327, 724, E29.343, 924, 659

(56) References Cited

U.S. PATENT DOCUMENTS

| | | | |
|---|---|---|---|
| 4,410,874 A | * 10/1983 | Scapple et al. | 29/613 |
| 4,758,896 A | 7/1988 | Ito | 358/236 |
| 5,428,242 A | 6/1995 | Furuya et al. | 257/538 |
| 5,534,727 A | 7/1996 | Inoue | 257/659 |
| 5,904,496 A | * 5/1999 | Richards et al. | 438/106 |
| 6,127,701 A | 10/2000 | Disney | 257/338 |
| 6,452,249 B1 | 9/2002 | Maeda et al. | 257/531 |
| 6,472,276 B1 | * 10/2002 | Hilt et al. | 438/285 |
| 2001/0020713 A1 | 9/2001 | Yoshitomi et al. | 257/306 |

FOREIGN PATENT DOCUMENTS

| | | | |
|---|---|---|---|
| DE | 100 62 232 A1 | 12/2001 | H01L/27/08 |
| EP | 0 567 694 A1 | 11/1993 | H01L/23/522 |
| EP | 0 940 849 A1 | 9/1999 | H01L/23/66 |
| JP | 04162660 | 6/1992 | H01L/27/04 |
| JP | 05283863 | 10/1993 | H05K/3/46 |
| JP | 2001267320 | 9/2001 | H01L/21/3205 |
| WO | WO 93/16491 | 8/1993 | H01L/21/90 |
| WO | WO 01/636646 A2 | 8/2001 | |

OTHER PUBLICATIONS

PCT Search Report for PCT /US 03/00526, 8 pages, Sep. 4, 2003.

* cited by examiner

Primary Examiner—Jasmine J B Clark
(74) Attorney, Agent, or Firm—Baker Botts L.L.P.

(57) ABSTRACT

A ground shield for an integrated component device to prevent coupling between integrated capacitors and/or inductors and other integrated components. Components are formed upon a substrate. A conductive metal layer is formed or deposited thereon. The conductive metal layer is electrically connected to ground and an isolation layer is formed or deposited upon the conductive metal layer. An integrated capacitor, for example a MIM-type capacitor, is then formed upon the isolation layer. The grounded conductive metal layer absorbs electrical noise such that coupling between the capacitor and other components is prevented.

14 Claims, 3 Drawing Sheets

INTEGRATED GROUND SHIELD

FIELD OF THE INVENTION

The present invention relates generally to integrated component devices, and more specifically to an improved design to prevent electrical coupling between integrated components.

BACKGROUND

Given the trend of the miniaturization of electronics for devices such as cell phones and personal digital assistants (PDAs), the use of integrated component devices is increasing. Methods for fabricating integrated component devices are known in the art. One prior art method of fabricating integrated resistors is to deposit, or form, a resistive layer on a silicon substrate and use portions of polysilicon to form resistive elements. Integrated capacitors may be formed by adding conductive and dielectric layers to the substrate. A metal-insulator-metal (MIM) type capacitor may be formed by depositing a conductive layer (e.g., aluminum) on the substrate. The conductive layer is followed by a dielectric layer, and another conductive layer, to form integrated capacitors.

FIG. 1 illustrates an integrated component device having resistors and capacitors formed thereon in accordance with the prior art. Integrated device 100, shown in FIG. 1, has a substrate layer 105. The substrate may be silicon, ceramic, glass, or other similar material. Substrate 105 has deposited, or formed, thereon an isolation layer 110. The isolation layer 110 may be formed by oxidizing the surface of the silicon. Polysilicon layer 115 is used to form the resistive elements. Polysilicon layer may be deposited on isolation layer 110 with isolation layer 110 separating the substrate 105 from the polysilicon layer 115. Another isolating layer 120, which may also be silicon dioxide is deposited or formed upon layer 115. Isolating layer 120 separates the resistive component from subsequently formed components. A MIM-type capacitor may be formed by adding a metal layer 125 (e.g., aluminum), an insulating layer 130 (e.g., a dielectric to improve capacitance), and another metal layer 135, which may also be aluminum.

Active components may be fabricated using similar, albeit more involved, methods known in the art.

Typical integrated component devices may contain tens of thousands of components on a die having an area of less than 1 mm square. The components may be fabricated within a micron of each other. Such proximity may cause electrical coupling between capacitors and other components. Coupling may occur between inductors and other components as well. This problem may be addressed by increasing the distance between the components on the die. This physical separation has the drawback of reducing the number of components that may be fabricated on the die thereby increasing cost and system size.

SUMMARY OF THE INVENTION

An integrated component device is described. The integrated component device comprises a substrate having a plurality of integrated components formed thereon. The plurality of integrated components including at least one first type of integrated component and at least one second type of integrated component. Integrated within the device is a ground shield to electrically separate the at least one first type of integrated component from the at least one second type of integrated component.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

As will be discussed in more detail below, one embodiment of the present invention is an integrated component device is described. The integrated component device may contain capacitors and other passive components and may contain active components as well. The capacitors are electrically separated from the other active and passive components by an integrated ground shield.

In one embodiment the integrated ground shield is a layer of conductive metal (e.g., aluminum) connected to ground.

An intended advantage of one embodiment of the invention is to prevent the electrical coupling of integrated capacitors and other integrated components in close proximity. Another intended advantage of one embodiment of the invention is to allow dense integration of components on a substrate.

In the following detailed description of the present invention, numerous specific details are set forth in order to provide a thorough understanding of the present invention. However, it will be apparent to one skilled in the art that the present invention may be practiced without these specific details. In some instances, well-known structures and devices are shown in block diagram form, rather than in detail, in order to avoid obscuring the present invention.

Figure 1:
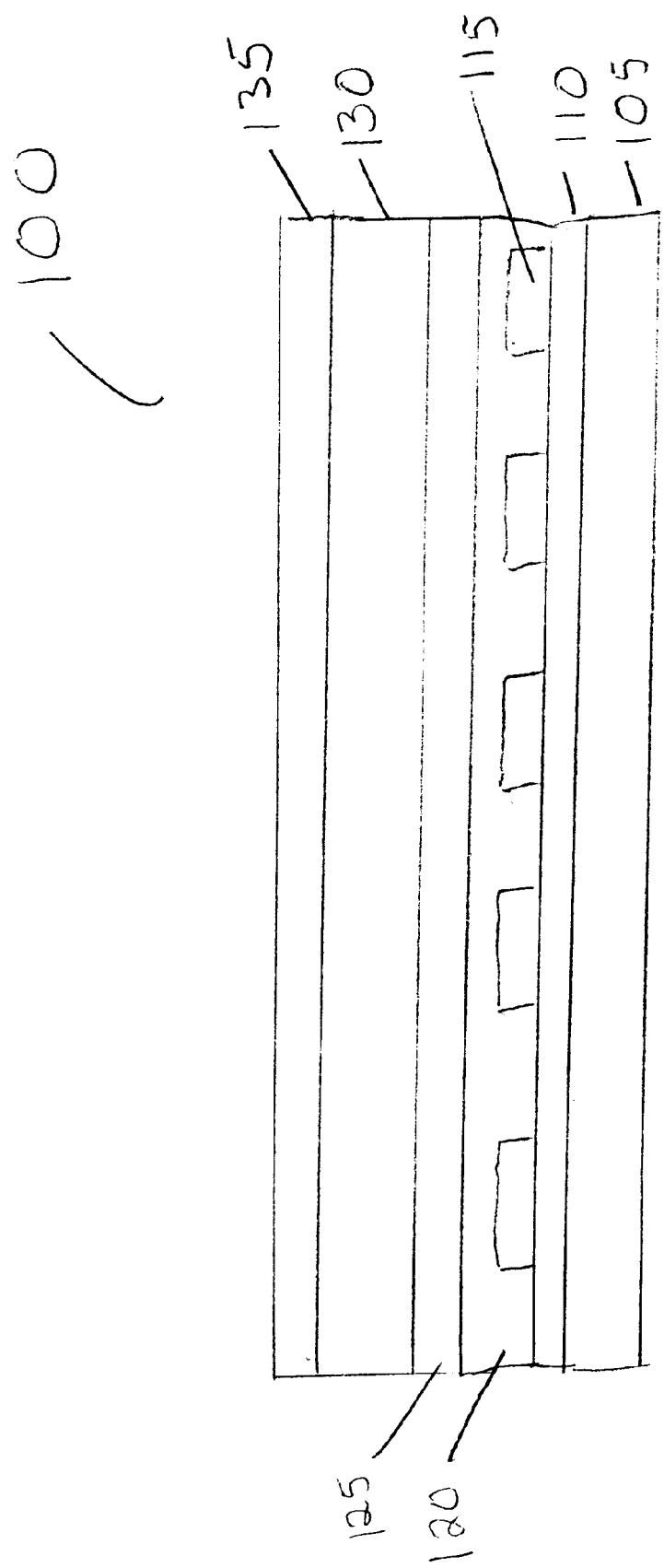
FIG. 1 illustrates an integrated component device having resistors and capacitors formed thereon in accordance with the prior art.
Figure 2:
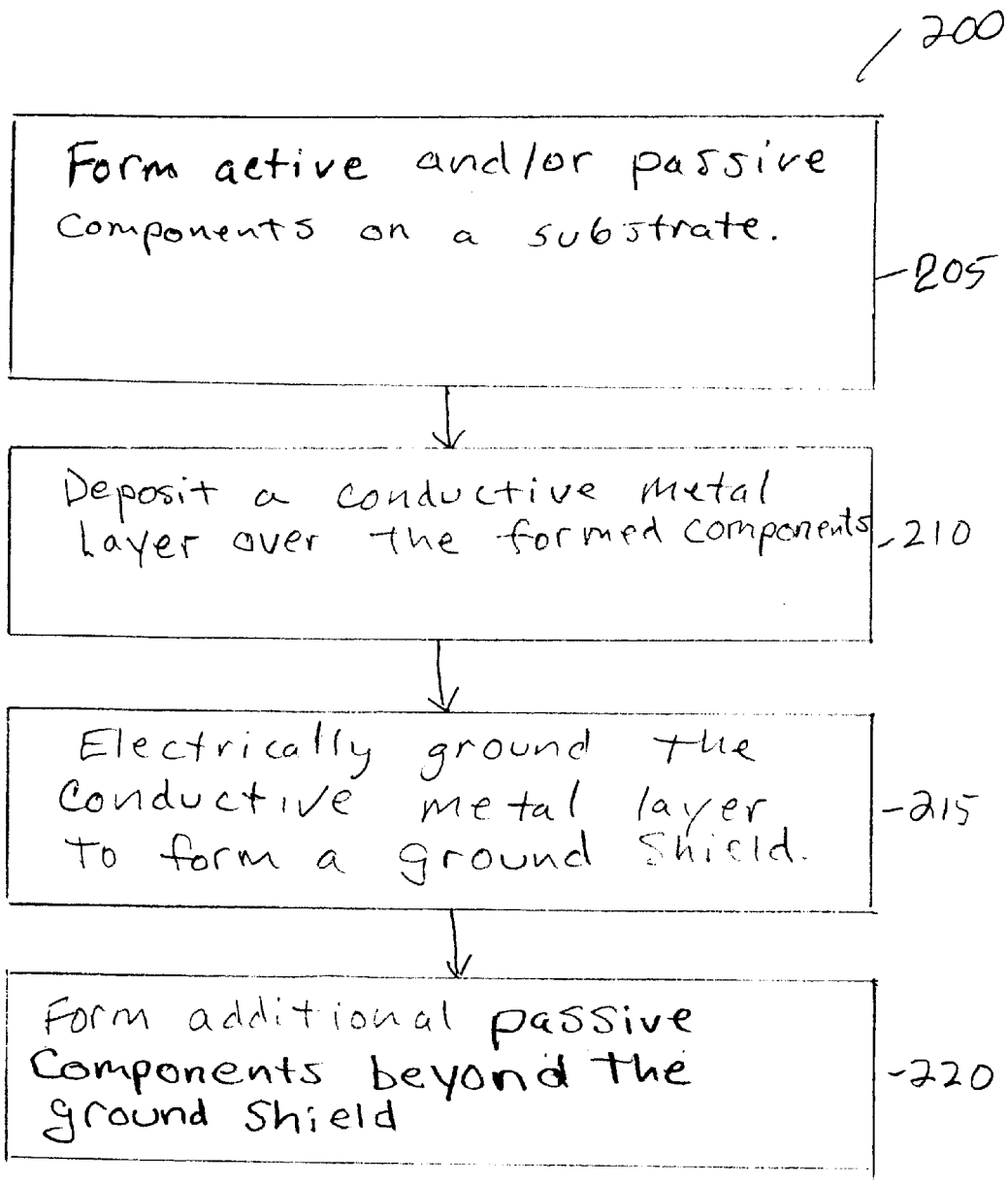
FIG. 2 is a process flow diagram in accordance with one embodiment of the present invention.

FIG. 2 is a process flow diagram in accordance with one embodiment of the present invention. Process 200, shown in FIG. 2, begins with operation 205 in which active and/or passive components are formed on a substrate. As discussed above in reference to FIG. 1, the substrate may be silicon, glass, ceramic or similar suitable material. The components may be fabricated through various methods known in the art.

At operation 210, a conductive metal layer is deposited over the components formed at operation 205. For one embodiment the conductive metal layer may be a layer of aluminum approximately 0.57 um thick. For one embodiment the conductive metal layer may be deposited through a metal deposition process as known in the art.

At operation 215 the conductive metal layer is connected to ground thus forming an electrical ground shield. The conductive metal layer may be connected to the nearest ground line by vias or alternatively may be directly connected to the ground pad.

At operation 220 additional passive and/or active components are formed on top of or adjacent to the electrical ground shield. The ground shield will absorb the electrical noise from the components thereby preventing coupling between, for example, integrated resistors and capacitors.

Figure 3A:
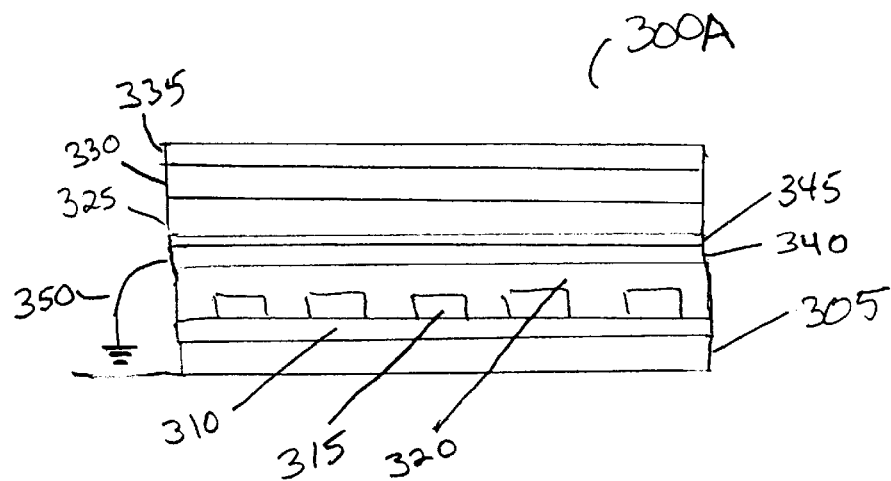
FIGS. 3A–3B illustrates an integrated component device in accordance with one embodiment of the present invention.
Figure 3B:
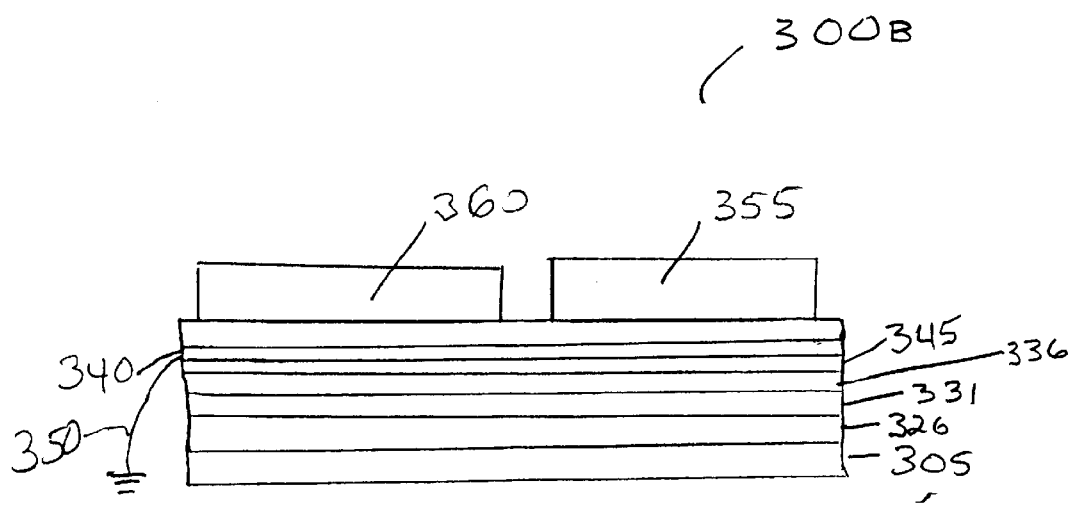
Figure 1:
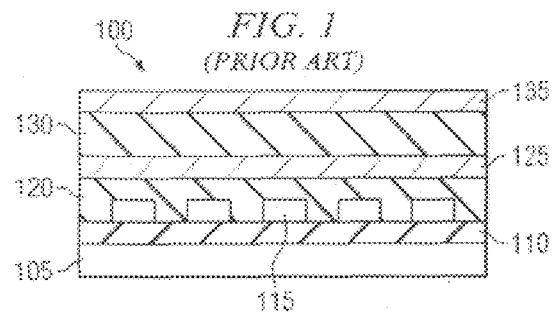
Figure 2:
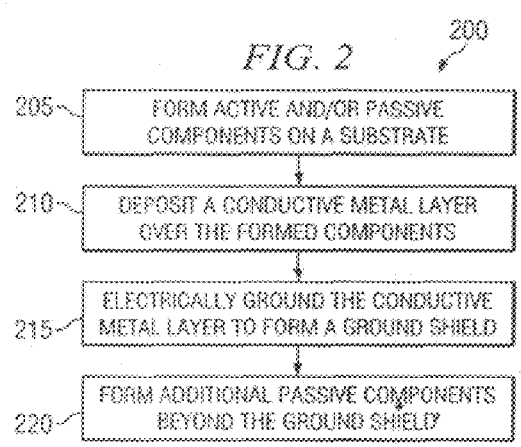
Figure 3A:
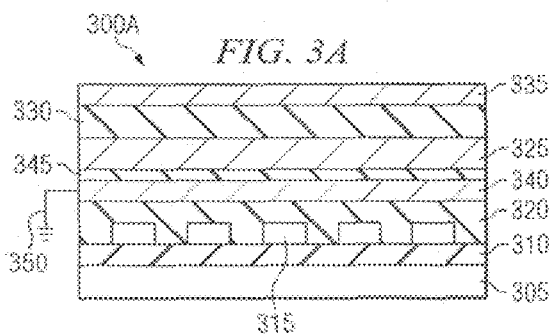
Figure 3B:
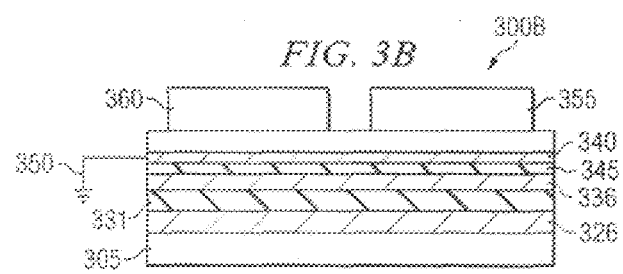

FIGS. 3A and 3B illustrate alternative embodiments of integrated component devices in accordance with the present invention. Integrated device 300A, shown in FIG. 3A, has a substrate layer 305. The substrate may be silicon, ceramic, glass, or other similar material. Substrate 105 has deposited, or formed, thereon an isolation layer 310, a selectively deposited polysilicon layer 315, and another isolation layer, these layers form a resistor as-described above in reference to FIG. 1. A conductive metal layer 340 is deposited upon isolation layer 320. The conductive metal layer may be, for example, a layer of aluminum approximately 0.57 um in thickness. In alternative embodiments the conductive metal layer 340 may be other metals. The conductive metal layer may be deposited through a deposition and patterning process known in the art.

Formed above the conductive metal layer 340 is another isolation layer 345 that may be, for example silicon dioxide. Above isolation layer 345 a typical MIM-type capacitor is formed by metal layer 325, insulating layer 330, and metal layer 335. The conductive metal layer 340 is grounded via ground connection 350. The conductive metal layer, therefore electrically isolates the resistor formed by layers 310, 315, and 320 form the MIM-type capacitor formed by layers 325, 330, and 335. The conductive metal layer shields the integrated resistor from any parasitic capacitance from the integrated capacitor. Thus, electrical coupling of the capacitor and other components (e.g., resistors) of the integrated component device is significantly reduced or prevented.

FIG. 3B illustrates an alternative embodiment in accordance with the present invention. Integrated component device 300B, shown in FIG. 3B, includes a substrate 305 with a MIM-type capacitor formed by metal 326, insulating layer 311, and metal layer 336. Insulating layer 345 covers the MIM-type capacitor. As described above, conductive metal layer 340 is deposited upon insulating layer 345. Conductive metal layer 340 is connected to ground via connection 350. Other integrated components may be formed on top of the conductive metal layer 340. For example, transistors 355, or diodes 360 may be formed on conductive metal layer 340 that prevents electrical coupling between the capacitor and the other integrated components.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. A device comprising:
    a substrate having a plurality of integrated components formed thereon, the plurality of integrated components including at least one first type of integrated component and at least one second type of integrated component; and
    an integrated ground shield comprising a conductive metal layer coupled to ground, wherein the integrated ground shield electrically separates the at least one first type of integrated component from the at least one second type of integrated component.

2. The device of claim 1, wherein the grounded conductive metal layer comprises aluminum.

3. The device of claim 1, wherein the plurality of integrated components include passive components.

4. The device of claim 1, wherein the plurality of integrated components include active components.

5. The device of claim 1, wherein the plurality of integrated components include active and passive components.

6. The device of claim 1, wherein the substrate is comprised of a material selected from the group consisting essentially of silicon, ceramic, and glass.

7. The device of claim 1, wherein the plurality of integrated components are components selected from the group consisting of resistors, capacitors, inductors, diodes, and transistors.

8. A device comprising:
    an integrated capacitor formed upon a substrate;
    an isolation layer formed upon the capacitor;
    a ground shield formed upon the isolation layer; and
    an integrated component formed upon the ground shield such that the ground shield prevents electrical coupling between the integrated capacitor and the integrated component.

9. The device of claim 8, wherein the integrated ground shield comprises a conductive metal layer coupled to ground.

10. The device of claim 9, wherein the grounded conductive metal layer comprises aluminum.

11. The device of claim 8, wherein the integrated component is a passive component.

12. The device of claim 8, wherein the integrated component is an active component.

13. The device of claim 9, wherein the conductive metal layer comprises a layer of metal selected from the group consisting essentially of copper, silver, gold, hafnium, nickel, tantalum, zirconium, and alloys thereof.

14. The device of claim 10, wherein the grounded layer of aluminum is approximately 0.57 um thick.

* * * * *

UNITED STATES PATENT AND TRADEMARK OFFICE
CERTIFICATE OF CORRECTION

PATENT NO. : 6,744,129 B2  
DATED : June 1, 2004  
INVENTOR(S) : Lee Chew et al.

It is certified that error appears in the above-identified patent and that said Letters Patent is hereby corrected as shown below:

Drawings,  
Delete Sheets 1 of 3, 2 of 3 and 3 of 3, and replace with the attached sheet 1 of 1.

Signed and Sealed this

Twelfth Day of October, 2004

JON W. DUDAS  
*Director of the United States Patent and Trademark Office*